United States Patent
Xu et al.

(10) Patent No.: US 9,887,374 B2
(45) Date of Patent: Feb. 6, 2018

(54) ORGANIC THIN FILM TRANSISTOR AND A MANUFACTURING METHOD OF THE SAME

(71) Applicant: SHENZHEN CHINA STAR OPTOELECTRONICS TECHNOLOGY CO., LTD., Shenzhen, Guangdong (CN)

(72) Inventors: Hongyuan Xu, Guangdong (CN); Changi Su, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 124 days.

(21) Appl. No.: 14/906,017

(22) PCT Filed: Dec. 31, 2015

(86) PCT No.: PCT/CN2015/100234
§ 371 (c)(1),
(2) Date: Jan. 19, 2016

(87) PCT Pub. No.: WO2017/084187
PCT Pub. Date: May 26, 2017

(65) Prior Publication Data
US 2017/0237028 A1    Aug. 17, 2017

(30) Foreign Application Priority Data

Nov. 18, 2015  (CN) .......................... 2015 1 0802435

(51) Int. Cl.
*H01L 51/10* (2006.01)
*H01L 27/32* (2006.01)
(Continued)

(52) U.S. Cl.
CPC ........ *H01L 51/105* (2013.01); *H01L 27/3274* (2013.01); *H01L 27/3276* (2013.01);
(Continued)

(58) Field of Classification Search
CPC .............. H01L 51/105; H01L 51/0071; H01L 51/0541; H01L 27/3274; H01L 27/3276
See application file for complete search history.

(56) References Cited

U.S. PATENT DOCUMENTS

2007/0132023 A1    6/2007  Ahn et al.
2010/0084653 A1*   4/2010  Yamazaki ........... H01L 27/0266
                                                          257/43
(Continued)

FOREIGN PATENT DOCUMENTS

CN    1983662 A    6/2007
CN    101136454 A  3/2008
(Continued)

*Primary Examiner* — Phuc Dang
(74) *Attorney, Agent, or Firm* — Ladas & Parry LLP (57) ABSTRACT

An organic thin film transistor (OTFT) is disclosed herein. The OTFT has a substrate, a data line, a transfer pad, a source electrode, a drain electrode, an active pattern, a first insulating layer, a gate electrode, a second insulating layer, and a transparent electrode. The data line and the transfer pad are disposed on the substrate. The source electrode and the drain electrode are disposed on the substrate, the data line, and the transfer pad. The active pattern is disposed on the data line, the transfer pad, the substrate, the source electrode, and the drain electrode. With the disposition of the active pattern on the source electrode and the drain electrode, the source electrode and the drain electrode are free from the bombardment of the plasma.

15 Claims, 7 Drawing Sheets

(51) Int. Cl.
    *H01L 51/05*    (2006.01)
    *H01L 51/00*    (2006.01)
(52) U.S. Cl.
    CPC ...... *H01L 51/0017* (2013.01); *H01L 51/0541* (2013.01); *H01L 2251/301* (2013.01); *H01L 2251/308* (2013.01)

(56) References Cited

U.S. PATENT DOCUMENTS

| | | | | |
|---|---|---|---|---|
| 2011/0115006 | A1* | 5/2011 | Sato | H01L 27/1237 |
| | | | | 257/296 |
| 2012/0280238 | A1* | 11/2012 | Kimura | H01L 27/1225 |
| | | | | 257/59 |
| 2012/0298972 | A1 | 11/2012 | Zhang | |
| 2013/0228756 | A1* | 9/2013 | Lee | H01L 51/52 |
| | | | | 257/40 |
| 2015/0021592 | A1* | 1/2015 | Seo | H01L 29/7869 |
| | | | | 257/43 |
| 2016/0126494 | A1* | 5/2016 | Jung | H01L 27/3258 |
| | | | | 257/72 |
| 2017/0025493 | A1* | 1/2017 | Xu | H01L 27/3274 |
| 2017/0104033 | A1* | 4/2017 | Su | H01L 27/283 |

FOREIGN PATENT DOCUMENTS

| | | |
|---|---|---|
| CN | 102779942 A | 11/2012 |
| JP | 2014082386 A | 5/2014 |

\* cited by examiner

ORGANIC THIN FILM TRANSISTOR AND A MANUFACTURING METHOD OF THE SAME

BACKGROUND OF THE INVENTION

Field of Invention

The present invention relates to the field of OTFTs (Organic Thin Film Transistors), and more particularly to, an OTFT and a manufacturing method of the same.

Description of Prior Art

An OTFT is a TFT (Thin Film Transistor) which is manufactured by organic material as the material of the semiconductor, most of them are applied on a plastic substrate, for its features on curability and low manufacturing cost, it has the most potential of new array techniques for the next generation of flexible displays at the present time. The OTFT manufacturing method is easier than the traditional inorganic TFT manufacturing method, and the OTFT manufacturing method requires low forming atmospheric conditions and purity, so the manufacturing cost is much lower; furthermore, the OTFT has excellent flexibility, which is suitable for fields of flexible displays, electronic skins, and flexible sensors.

In order to lower the injection barrier, the electrode material of the OTFT is generally chosen to be metals such as gold or silver. However, gold is too expensive for mass production. Silver is relatively cheaper than gold, however, a surface of silver is easy to oxidize, then causing a sharp decline on the conductivity, while the surface of silver be bombarded by plasma.

SUMMARY OF THE INVENTION

An objective of the present invention is to provide an OTFT and a manufacturing method of the same to solve the technical issue above.

To achieve the above objective, the present invention provides an OTFT, which comprises a substrate, a data line, a transfer pad, a source electrode, a drain electrode, an active pattern, a first insulating layer, a gate electrode, a second insulating layer, and a transparent electrode.

The data line and the transfer pad are disposed on the substrate. The source electrode and the drain electrode are disposed on the substrate, the data line, and the transfer pad. The active pattern is disposed on the data line, the transfer pad, the substrate, the source electrode, and the drain electrode. The first insulating layer is disposed on the data line, the transfer pad, and the active pattern. The gate electrode and a scanning line are disposed on the first insulating layer. The second insulating layer is disposed on the gate electrode and the first insulating layer. The transparent electrode is disposed on the second insulating layer and electrically connected with the transfer pad by penetrating through a through hole in the first insulating layer and the second insulating layer.

In one preferred embodiment, the data line and the transfer pad are made of titanium or molybdenum.

In one preferred embodiment, the source electrode and the drain electrode are made of silver.

In one preferred embodiment, the gate electrode is made of aluminum or copper.

In one preferred embodiment, the transparent electrode is made of ITO (Indium tin oxide).

To achieve the above objective, the present invention provides an OTFT manufacturing method, which comprises:

First, a substrate is disposed; then, a first metal layer is disposed on the substrate; then, the first metal layer is etched by using a first tone-mask, to form a data line and a transfer pad; then, a second metal layer is disposed on the substrate, the data line, and the transfer pad; the second metal layer is etched by using a second tone-mask, to form a source electrode and a drain electrode; then, an organic semiconductor layer is coated on the data line, the transfer pad, the substrate, the source electrode, and the drain electrode; then, the organic semiconductor layer is etched by using a third tone-mask, to form an active pattern; then, a first insulating layer is coated on the data line, the transfer pad, and the active pattern; then, a third metal layer is disposed on the first insulating layer; then, the third metal layer is etched by using a fourth tone-mask, to form a gate electrode and a scanning line; then, a second insulating layer is coated on the third metal layer and the first insulating layer; then, a through hole is formed in the first insulating layer and the second insulating layer; finally, a transparent electrode is disposed on the second insulating layer and electrically connected with the transfer pad with the through hole.

In one preferred embodiment, the data line and the transfer pad are made of titanium or molybdenum.

In one preferred embodiment, the source electrode and the drain electrode are made of silver.

In one preferred embodiment, the gate electrode is made of aluminum or copper.

In one preferred embodiment, the transparent electrode made of is ITO.

Compared with the conventional art, the present invention firstly disposes the data line and the transfer pad on the substrate, then disposes the source electrode and the drain electrode on the data line and the transfer pad, then covering the source electrode and the drain electrode with the active pattern. Because the active pattern covers the source electrode and the drain electrode, the source electrode and the drain electrode are free from the bombardment of the plasma.

DETAILED DESCRIPTION OF THE PREFERRED EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 1:
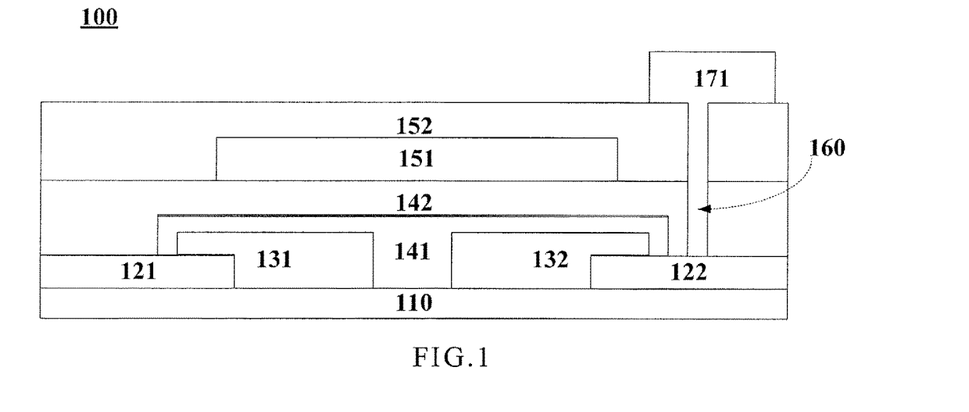
FIG. 1 shows a side view of an OTFT according to the present invention.

FIG. 1 shows a side view of an OTFT 100 according to the present invention. The OTFT 100 comprises a substrate 110, a data line 121, a transfer pad 122, a source electrode 131, a drain electrode 132, an active pattern 141, a first insulating layer 142, a gate electrode 151, a second insulating layer 152, a through hole 160 and a transparent electrode 171.

The data line 121 and the transfer pad 122 are disposed on the substrate 110. Specifically, the data line 121 and the transfer pad 122 are made of titanium or molybdenum.

The source electrode 131 and the drain electrode 132 are disposed on the substrate 110, the data line 121, and the transfer pad 122. In detail, the source electrode 131 and the drain electrode 132 are disposed on a part of the data line 121 and the transfer pad 122. The source electrode 131 and the drain electrode 132 are disconnected from each other. Specifically, the source electrode 131 and the drain electrode 132 are made of silver.

The active pattern 141 is disposed on the data line 121, the transfer pad 122, the substrate 110, the source electrode 131, and the drain electrode 132. In detail, the active pattern 141 completely covers the source electrode 131 and the drain electrode 132, to protect the source electrode 131 and the drain electrode 132 from the bombardment of the plasma. Specifically, the active pattern 141 can be made of an organic semiconductor.

The first insulating layer 141 is disposed on the data line 121, the transfer pad 122, and the active pattern 141. In detail, the first insulating layer 141 must completely cover the data line 121, the transfer pad 122, and the active pattern 141. Generally, the first insulating layer 141 can be made of an organic insulator.

The gate electrode 151 and a scanning line are disposed on the first insulating layer 142. With the isolation of the first insulating layer 141, the gate electrode 151 and the scanning line are free from short circuits with the data line 121, the substrate 110, the source electrode 131 and the drain electrode 132. Specifically, the gate electrode 151 is made of aluminum or copper.

The second insulating layer 152 is disposed on the gate electrode 151 and the first insulating layer 142. Generally, the second insulating layer 152 can be an organic insulator.

The transparent electrode 171 is disposed on the second insulating layer 152 and electrically connected with the transfer pad 122 by penetrating through the through hole 160 in the first insulating layer 142 and the second insulating layer 152. Specifically, the transparent electrode is made of ITO.

With disposing the data line 121 and the transfer pad 122 on the substrate 110, then disposing the source electrode 131 and the drain electrode 132 on the data line 121 and the transfer pad 122, then covering the source electrode 131 and the drain electrode 132 with the active pattern 141, the source electrode 131 and the drain electrode 132 are free from the bombardment of the plasma.

Refer to FIGS. 2-14, which show the flow diagram of the OTFT 100 manufacturing method according to the present invention.

Figure 2:
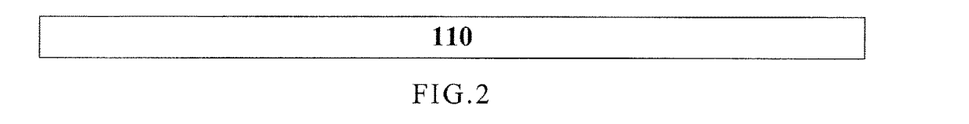
FIGS. 2-3, 4a, 4b, 5, 6a, 6b, 7, 8a, 8b, 9-10, 11a, 11b, 12-14 show the flow diagram of the OTFT manufacturing method according to the present invention.

First, refer to FIG. 2, which shows a side view of the first step of the OTFT 100 of the present invention, a substrate 110 is disposed.

Figure 3:
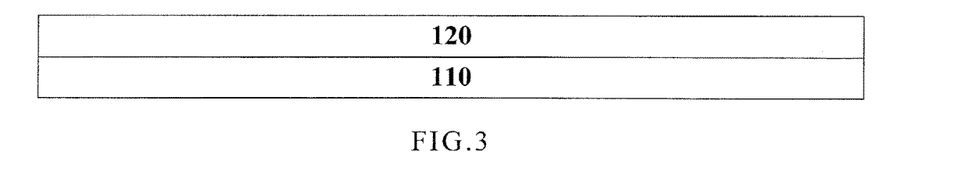
Figure 4A:
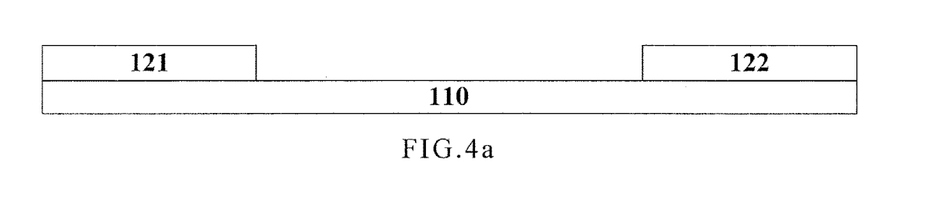
Figure 4B:
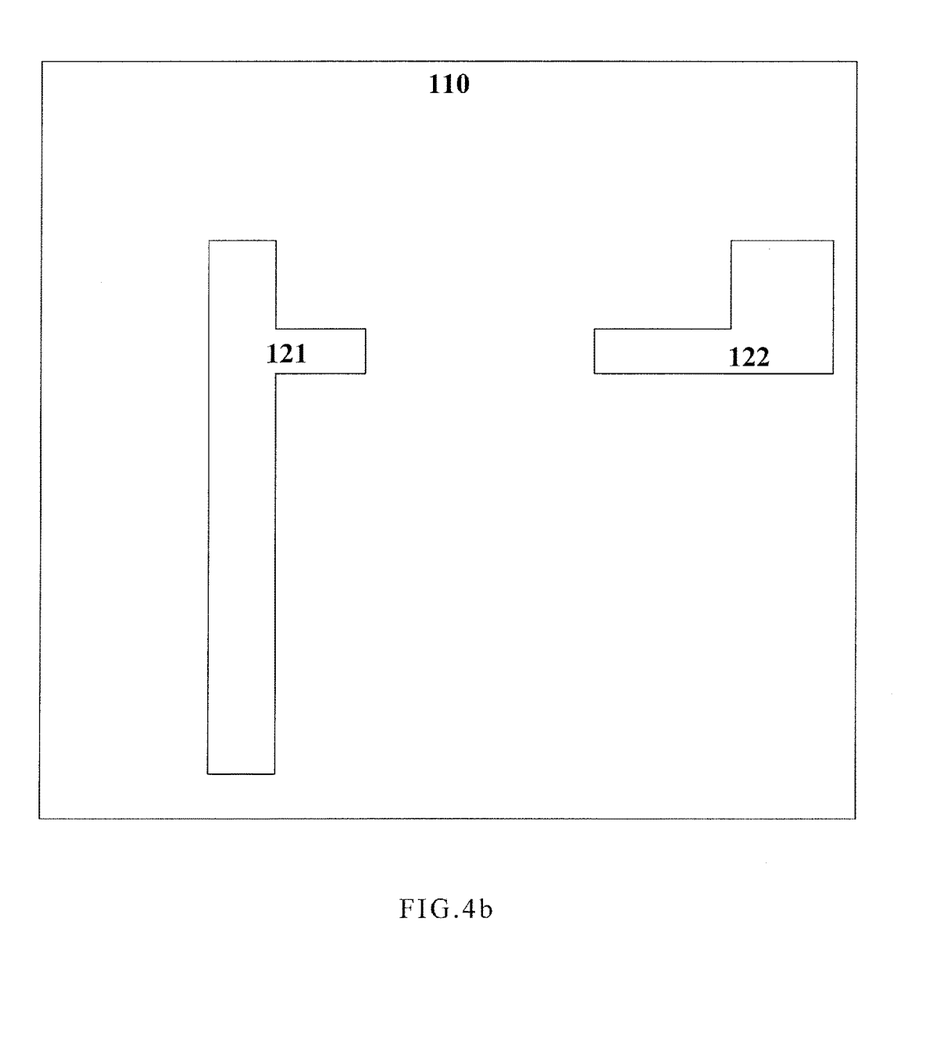

Refer to FIG. 3, which shows a side view of the second step of the OTFT 100 of the present invention, a first metal layer 120 is disposed on the substrate 110. Refer to FIGS. 3, 4a, and 4b. FIGS. 4a and 4b show a side view and a top view of the third step of the OTFT 100 of the present invention, the first metal layer 120 is etched by using a first tone-mask, to form a data line 121 and a transfer pad 122.

Figure 5:
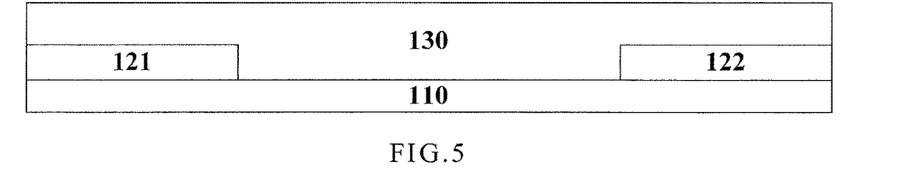
Figure 6A:
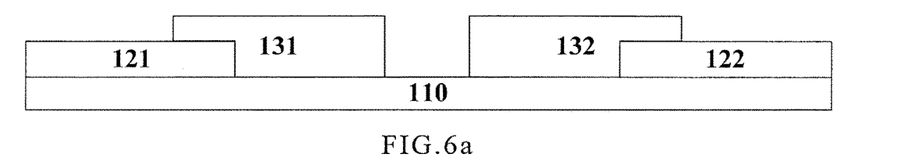
Figure 6B:
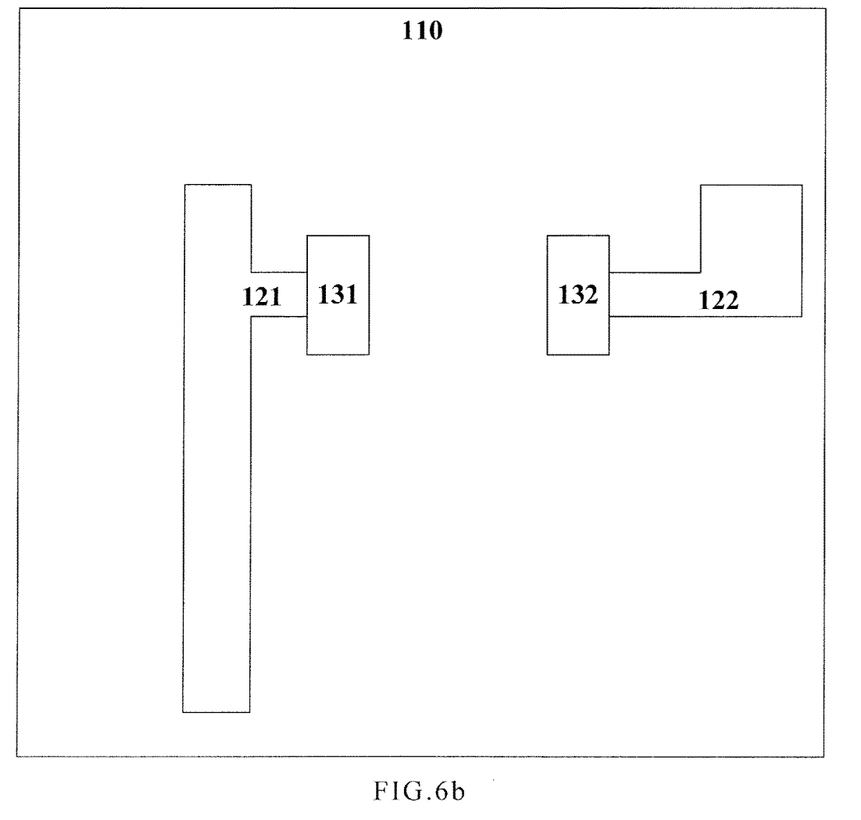

Then, refer to FIG. 5, which shows a side view of the fourth step of the OTFT 100 of the present invention, a second metal layer 130 is disposed on the substrate 110, the data line 121, and the transfer pad 122. Refer to FIGS. 5, 6a, and 6b. FIGS. 6a and 6b show a side view and a top view of the fifth step of the OTFT 100 of the present invention, the second metal layer 130 is etched by using a second tone-mask, to form a source electrode 131 and a drain electrode 132.

Figure 7:
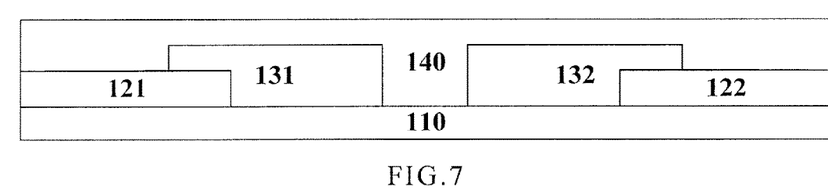
Figure 8A:
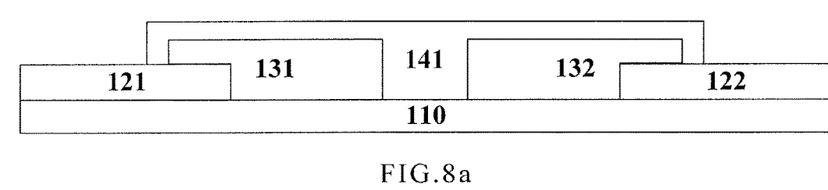
Figure 8B:
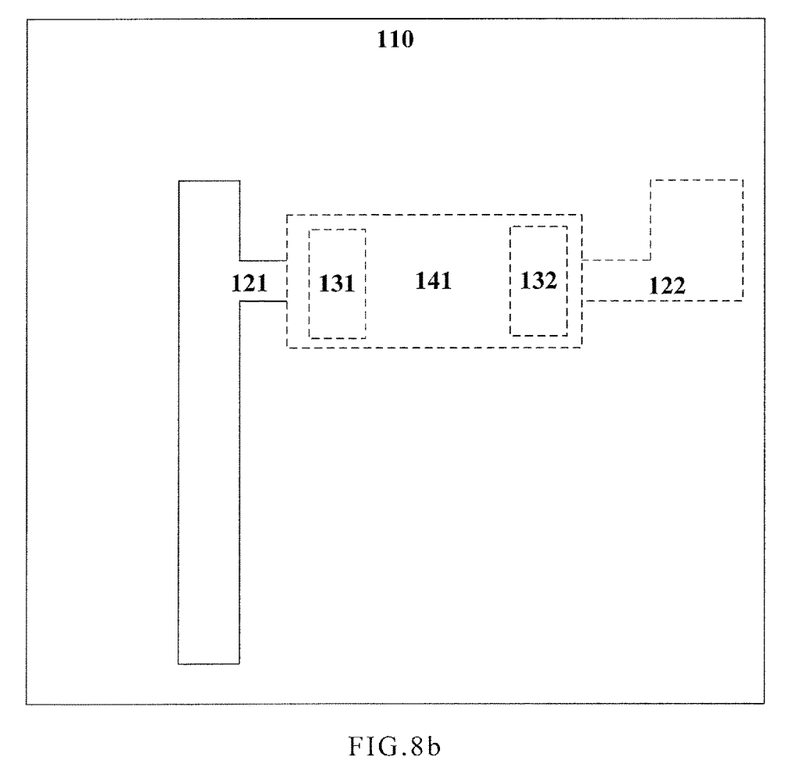

Refer to FIG. 7, which shows a side view of the sixth step of the OTFT 100 of the present invention, an organic semiconductor layer 140 is coated on the data line 121, the transfer pad 122, the substrate 110, the source electrode 121, and the drain electrode 122. Then, refer to FIGS. 7, 8a, and 8b. FIGS. 8a and 8b show a side view and a top view of the seventh step of the OTFT 100 of the present invention, the organic semiconductor layer 140 is etched by using a third tone-mask, to form an active pattern 141.

Figure 9:
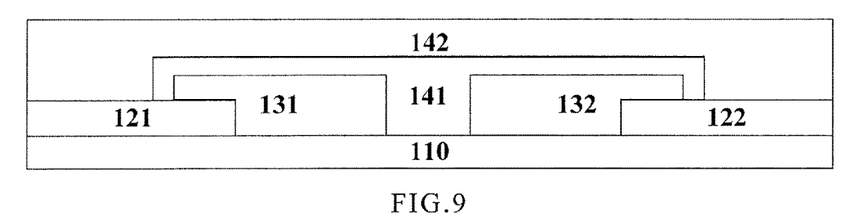

Then, refer to FIG. 9, which shows a side view of the eighth step of the OTFT 100 of the present invention, a first insulating layer 142 is coated on the data line 121, the transfer pad 122, and the active pattern 141.

Figure 10:
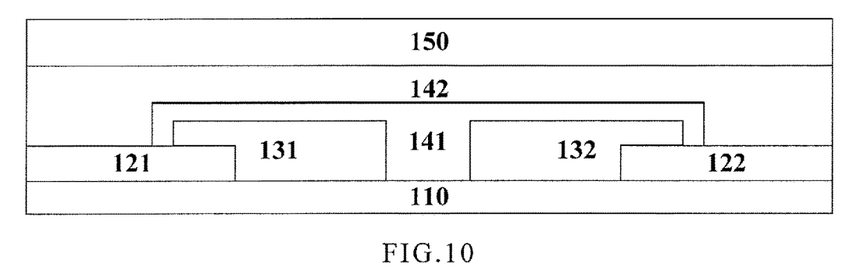
Figure 11A:
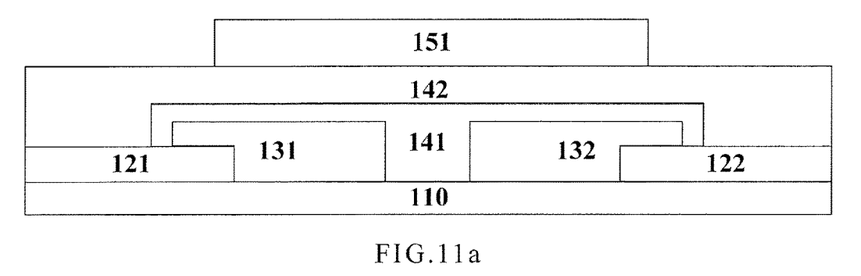
Figure 11B:
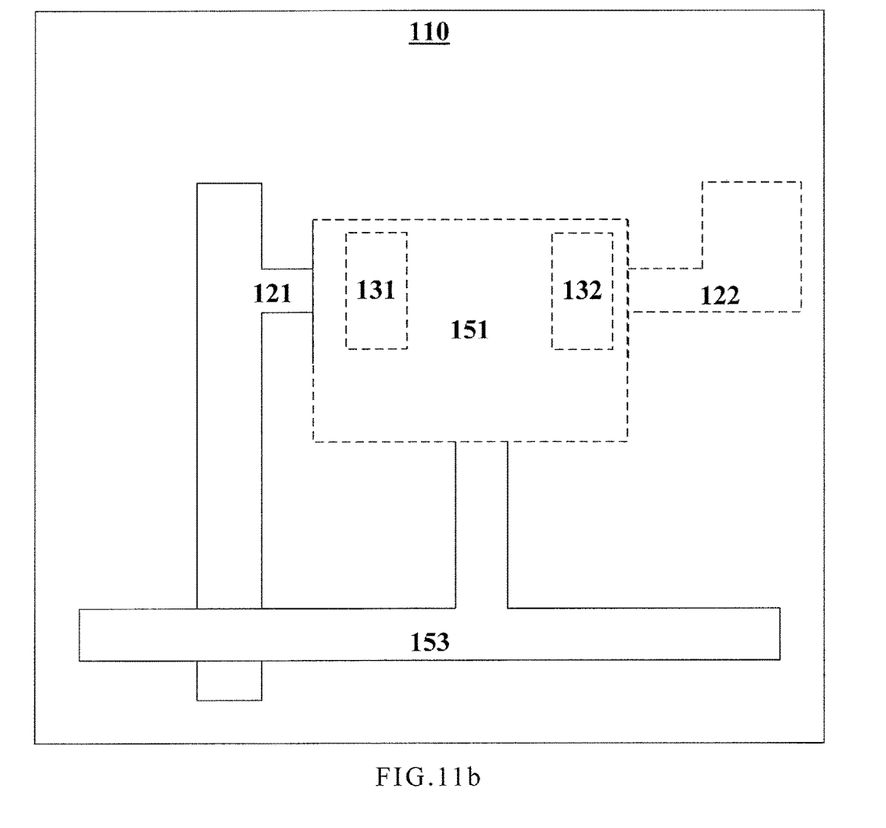

Then, refer to FIG. 10, which shows a side view of the ninth step of the OTFT 100 of the present invention, a third metal layer 150 is disposed on the first insulating layer 142. Refer to FIGS. 10, 11a, and 11b. FIGS. 11a and 11b show a side view and a top view of the tenth step of the OTFT 100 of the present invention the third metal layer 150 is etched by using a fourth tone-mask, to form a gate electrode 151 and a scanning line. The gate electrode 151 and the scanning line are electrically connected.

Figure 12:
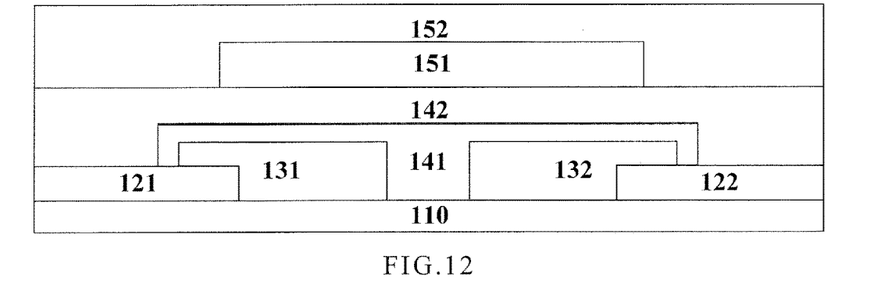
Figure 13:
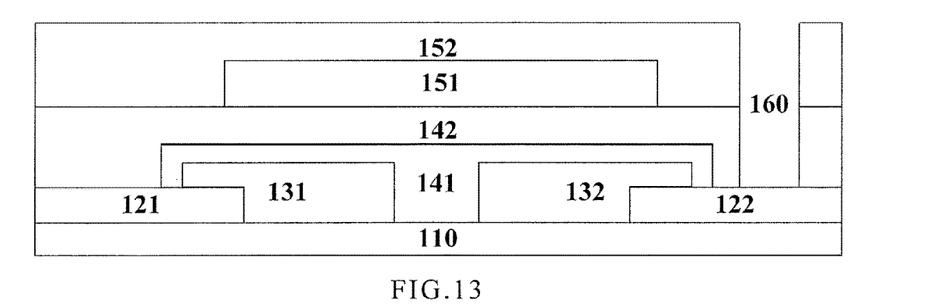
Figure 14:
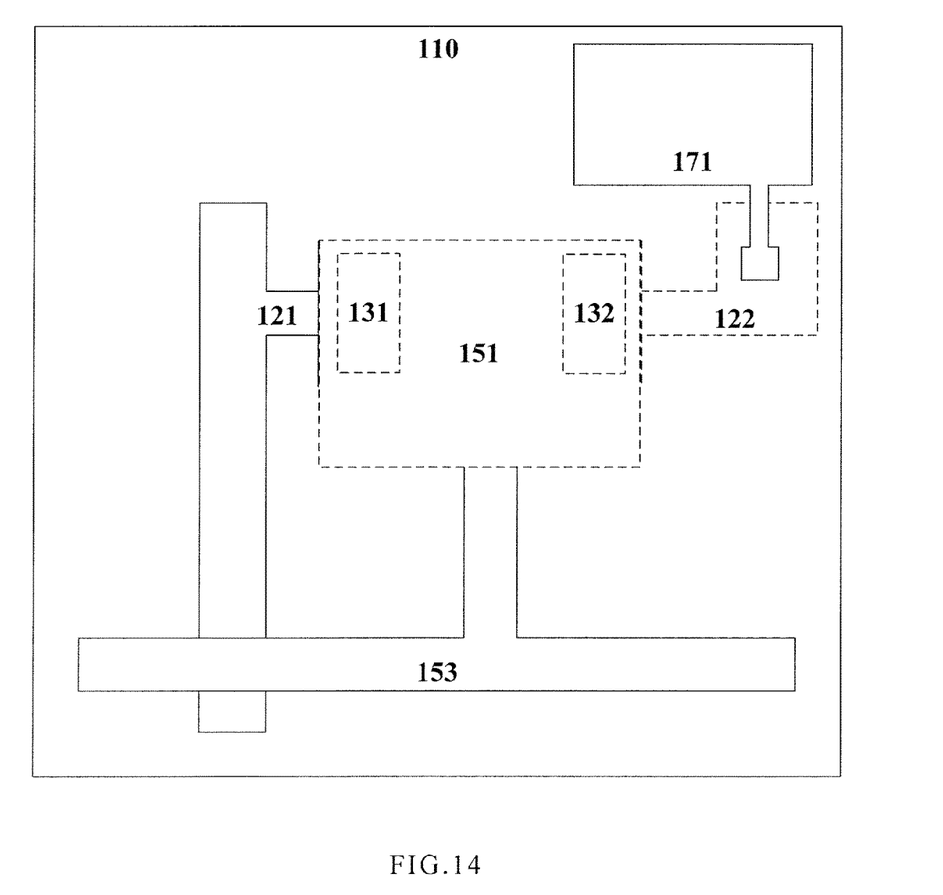

Refer to FIG. 12, which shows a side view of the eleventh step of the OTFT 100 of the present invention, a second insulating layer 152 is coated on the third metal layer 151 and the first insulating layer 142. Then, refer to FIG. 13, which shows a side view of the twelfth step of the OTFT 100 of the present invention, a through hole 160 is formed in the first insulating layer 142 and the second insulating layer 152. Refer to FIG. 14 is a top view of thirteenth step (the final structure of the OTFT) according to the present invention, and FIG. 1 is a side view of the final structure of the OTFT according to the present invention. A transparent electrode 170 is disposed on the second insulating layer 152 and electrically connected with the transfer pad 122 with the through hole 160. Then, the transparent electrode 170 is etched by using a fifth tone-mask, to form an anode of the organic light emitting diode.

The present invention firstly disposes the data line 121 and the transfer pad 122 on the substrate 110, then disposes the source electrode 131 and the drain electrode 132 on the data line 121 and the transfer pad 122, then covering the source electrode 131 and the drain electrode 132 with the active pattern 141, Because the active pattern 141 covers the source electrode 131 and the drain electrode 132, the source electrode 131 and the drain electrode 132 are free from the bombardment of the plasma.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:
1. An OTFT (organic thin film transistor), comprising:
a substrate;
a data line and a transfer pad, disposed on the substrate;
a source electrode and a drain electrode, disposed on the substrate, the data line, and the transfer pad;

an active pattern, disposed on the data line, the transfer pad, the substrate, the source electrode, and the drain electrode;

a first insulating layer, disposed directly on the data line, the transfer pad, and the active pattern;

a gate electrode and a scanning line, disposed on the first insulating layer;

a second insulating layer, disposed on the gate electrode and the first insulating layer; and a transparent electrode, disposed on the second insulating layer and electrically connected with the transfer pad by penetrating through a through hole in the first insulating layer and the second insulating layer;

wherein the data line and the transfer pad are formed by using a first tone-mask, and the source electrode and the drain electrode are formed by using a second tone-mask.

2. The OTFT according to claim 1, wherein the data line and the transfer pad are made of titanium or molybdenum.

3. The OTFT according to claim 1, wherein the source electrode and the drain electrode are made of silver.

4. The OTFT according to claim 1, wherein the gate electrode is made of aluminum or copper.

5. The OTFT according to claim 1, wherein the transparent electrode is made of ITO (Indium tin oxide).

6. An OTFT (organic thin film transistor), comprising:
a substrate;
a data line and a transfer pad, disposed on the substrate;
a source electrode and a drain electrode, disposed on the substrate, the data line, and the transfer pad;
an active pattern, disposed on the data line, the transfer pad, the substrate, the source electrode, and the drain electrode;
a first insulating layer, disposed directly on the data line, the transfer pad, and the active pattern;
a gate electrode and a scanning line, disposed on the first insulating layer;
a second insulating layer, disposed on the gate electrode and the first insulating layer; and
a transparent electrode, disposed on the second insulating layer and electrically connected with the transfer pad by penetrating through a through hole in the first insulating layer and the second insulating layer.

7. The OTFT according to claim 6, wherein the data line and the transfer pad are made of titanium or molybdenum.

8. The OTFT according to claim 6, wherein the source electrode and the drain electrode are made of silver.

9. The OTFT according to claim 6, wherein the gate electrode is made of aluminum or copper.

10. The OTFT according to claim 6, wherein the transparent electrode is made of ITO (Indium tin oxide).

11. An OTFT (organic thin film transistor) manufacturing method, comprising:
disposing a substrate;
disposing a first metal layer on the substrate;
etching the first metal layer by using a first tone-mask to form a data line and a transfer pad;
disposing a second metal layer on the substrate, the data line, and the transfer pad; etching the second metal layer by using a second tone-mask to form a source electrode and a drain electrode;
coating an organic semiconductor layer on the data line, the transfer pad, the substrate, the source electrode, and the drain electrode;
etching the organic semiconductor layer by using a third tone-mask to form an active pattern;
coating a first insulating layer directly on the data line, the transfer pad, and the active pattern;
disposing a third metal layer on the first insulating layer;
etching the third metal layer by using a fourth tone-mask to form a gate electrode and a scanning line;
coating a second insulating layer on the third metal layer and the first insulating layer;
forming a through hole in the first insulating layer and the second insulating layer; and
disposing a transparent electrode on the second insulating layer and electrically connecting with the transfer pad with the through hole.

12. The OTFT manufacturing method according to claim 11, wherein the data line and the transfer pad are made of titanium or molybdenum.

13. The OTFT manufacturing method according to claim 11, wherein the source electrode and the drain electrode are made of silver.

14. The OTFT manufacturing method according to claim 11, wherein the gate electrode is made of aluminum or copper.

15. The OTFT manufacturing method according to claim 11, wherein the transparent electrode is made of ITO (Indium tin oxide).

* * * * *